United States Patent [19]

Jastrzebski

[11] Patent Number: 4,751,561
[45] Date of Patent: Jun. 14, 1988

[54] DIELECTRICALLY ISOLATED PMOS, NMOS, PNP AND NPN TRANSISTORS ON A SILICON WAFER

[75] Inventor: Lubomir L. Jastrzebski, Plainsboro, N.J.

[73] Assignee: RCA Corporation, Princeton, N.J.

[21] Appl. No.: 33,378

[22] Filed: Apr. 2, 1987

Related U.S. Application Data

[62] Division of Ser. No. 857,154, Apr. 29, 1986, Pat. No. 4,685,199.

[51] Int. Cl.⁴ .................. H01L 27/02; H01L 29/06; H01L 29/78
[52] U.S. Cl. .......................... 357/44; 357/4; 357/23.1; 357/42; 357/43; 357/49; 357/55; 357/56; 357/80
[58] Field of Search .............. 357/42, 43, 44, 23.1, 357/4, 49, 80, 55, 56

[56] References Cited

U.S. PATENT DOCUMENTS

| | | | |
|---|---|---|---|
| 3,865,649 | 2/1975 | Beasom | 357/44 |
| 4,127,860 | 11/1978 | Beelitz et al. | 357/44 |
| 4,299,024 | 11/1981 | Piotrowski | 357/43 |
| 4,385,937 | 5/1983 | Ohmura | 357/42 |
| 4,481,707 | 11/1984 | Cunniff | 357/43 |
| 4,609,407 | 9/1986 | Masao et al. | 357/91 |

Primary Examiner—James J. Carroll
Assistant Examiner—Ngan Ngo
Attorney, Agent, or Firm—James M. Trygg; Allen L. Limberg; Kenneth R. Glick

[57] ABSTRACT

A plurality of monocrystalline silicon seeds is disposed on an insulator layer which is disposed on a substantially flat major surface of a silicon wafer. A first monocrystalline silicon deposit of first conductivity type is formed on a first silicon seed and a second monocrystalline silicon deposit, of similar configuration, is formed on a second silicon seed. The first and second deposits are then covered with insulator layers and a third monocrystalline deposit is formed on a third silicon seed. The third deposit has a top surface height substantially equal to or less than that of the top surfaces of the first and second deposits. An insulator layer is then formed on the top surface of the third deposit and first and second monocrystalline islands are formed on this insulator layer. Complementary bipolar transistors are formed in the first and second monocrystalline silicon deposits and PMOS and NMOS transistors are formed in the first and second islands on the third insulator layer.

4 Claims, 2 Drawing Sheets

DIELECTRICALLY ISOLATED PMOS, NMOS, PNP AND NPN TRANSISTORS ON A SILICON WAFER

This is a division of application Ser. No. 857,154, filed Apr. 29, 1986, now U.S. Pat. No. 4,685,199.

The present invention relates to a complementary metal oxide semiconductor (MOS) transistors and complementary bipolar transistors on a silicon wafer wherein each transistor is dielectrically isolated. More particularly, the invention relates to a unique structure for such structures on a relatively large semiconductor wafer in a cost-effective manner.

BACKGROUND OF THE INVENTION

As is well known in the semiconductor art, a complementary MOS (CMOS) device comprises an interconnected P channel MOS (PMOS) transistor and N channel MOS (NMOS) transistor. Similarly, a complementary bipolar device incorporates an interconnected NPN transistor and PNP transistor. The desirability of monolithic structures which incorporate complementary MOS transistors, e.g. for a logic function, and complementary bipolar transistors, e.g. for power control, is well recognized as described, for example, in U.S. Pat. No. 3,865,649 issued Feb. 11, 1975 to Beasom entitled "Fabrication Of MOS Devices And Complementary BiPolar Transistor Devices In A Monolithic Substrate" and U.S. Pat. No. 4,299,024 issued Nov. 10, 1981 to Piotrowski entitled "Fabrication Of Complementary Bipolar Transistors And CMOS Devices With Poly Gates."

In certain device applications, such as those in which a "radiation hard" structure is needed, it is further desirable for the various transistors on a device to be effectively electrically isolated from one another, such as by an interposed layer of dielectric material. However, such conventional dielectrically isolated (DI) structures are typically very expensive to fabricate owing to an inherently low-yield fabrication process. In addition to the description in the previously cited references, conventional DI structure fabrication processes are described in U.S. Pat. No. 3,689,357 issued Sept. 5, 1972 to Jordan entitled "Glass-Polysilicon Dielectric Isolation" and U.S. Pat. No. 3,938,176 issued Feb. 10, 1976 to Sloan, Jr. entitled "Process For Fabricating Dielectrically Isolated Semiconductor Components Of An Integrated Circuit." Basically, dielectric isolation processing involves the steps of (a) forming grooves in a monocrystalline silicon wafer; (b) forming an oxide dielectric layer on the wafer surface so as to coat the grooves; (c) depositing a thick (e.g. 250 microns) polycrystalline layer on the grooved wafer surface so as to provide a "handle" for further processing; (d) lapping the back side of the original wafer so as to expose the oxide covered grooves; and (e) forming transistors in the monocrystalline silicon "tubs" between the grooves.

This cumbersome conventional process is inefficient, expensive, and of low yield for a variety of reasons, including wafer warpage and crystalline defect density. Wafer warpage limits the diameter of processable wafers and routinely causes unacceptably wide deviations in flatness over relatively short distances on the wafer surface, in turn creating insurmountable photolithographic problems. Crystalline defects are induced in the dielectrically isolated tubs of silicon by virtue of the significant stress created by the polysilicon deposition and further impact device yield.

In an effort to overcome the very significant constraints of conventional DI device processing, the present invention was conceived.

SUMMARY OF THE INVENTION

A plurality of monocrystalline silicon seeds is disposed on an insulator layer which is disposed on a substantially flat major surface of a silicon wafer. A first monocrystalline silicon deposit of first conductivity type is formed on a first silicon seed and a second monocrystalline silicon deposit, of similar configuration, is formed on a second silicon seed. The first and second deposits are then covered with insulator layers and a third monocrystalline silicon deposit is formed on a third silicon seed. The third deposit has a top surface height substantially equal to or less than that of the top surfaces of the first and second deposits. An insulator layer is then formed on the top surface of the third deposit and first and second monocrystalline islands are formed on this insulator layer. Complementary bipolar transistors are formed in the first and second monocrystalline silicon deposits and PMOS and NMOS transistors are formed in the first and second islands in the third insulator layer.

DETAILED DESCRIPTION OF PREFERRED EMBODIMENT

Figure 1:
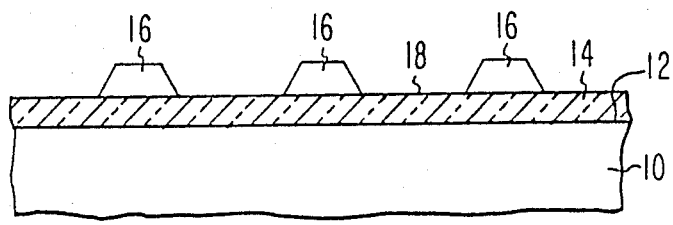
FIGS. 1-9 are sectional views of a semiconductor wafer which illustrate the basic steps of the fabrication sequence of the present invention.

As shown in FIG. 1, a silicon wafer 10 having a substantially flat major surface 12 with an insulator layer 14 thereon and a plurality of monocrystalline silicon seeds 16 on the surface 18 thereof is initially provided. The FIG. 1 illustration represents a small portion of a much larger structure. For example, the process herein described is applicable to large diameter (approximately 6 inches by today's standards) silicon wafers. The widths of and spacings between the monocrystalline silicon seeds 16 might be on the order of tens or hundreds of microns. In the preferred embodiment the insulator layer 14 is silicon oxide and the plurality of silicon seeds 16 is formed thereon by what is now termed the epitaxial lateral overgrowth (ELO) process, as described in U.S. Pat. No. 4,549,926, METHOD FOR GROWING MONOCRYSTALLINE SILICON ON A MASK LAYER, J. F. Corboy, Jr. et al., issued Oct. 29, 1985, and as further elaborated upon in commonly assigned co-pending U.S. patent application Ser. No. 818,032, METHOD FOR MAKING A SILICON-ON-INSULATOR SUBSTRATE, Lubomir L. Jastrzebski, filed Jan. 13, 1986 and Ser. No. 830,760, RECESSED OXIDE METHOD FOR MAKING A SILICON-ON-INSULATOR SUBSTRATE, Lubomir L. Jastrzebski, filed Feb. 19, 1986. Although the structure of FIG. 1 may be fabricated by other techniques, the described ELO process yields monocrystalline silicon seeds 16 of high crystalline quality having good adherence to the surface 18 of the insulator layer 14. The seeds are generally trapezoidal in cross-sectional shape.

Figure 2:
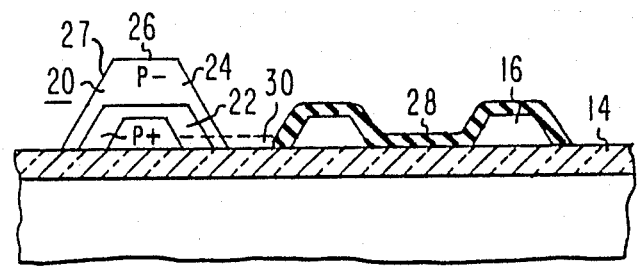

As shown in FIG. 2, a first monocrystalline silicon deposit 20 of first conductivity type is next selectively epitaxially formed on a first silicon seed 16. For convenience of description the first conductivity type is identified as P type. The deposit 20 includes a relatively high conductivity (P+ type) bottom portion 22 adjacent to the insulator layer 14 and a relatively low conductivity (P− type) top portion 24 extending from the bottom portion 22 to the top surface 26 of the deposit 20. The deposit 20 can be formed by conventional selective epitaxial deposition techniques such as the ELO technique elaborated upon in previously cited U.S. Pat. No. 4,549,926. The ELO process yields a deposit 20 which also has a generally trapezoidal shape having a top surface 26 and sloping sides 27. The relatively high and low conductivities of the bottom and top portions 22 and 24 can readily be adjusted by appropriately varying the P type dopant concentration during the epitaxial deposition. The selectivity of the epitaxial growth can be achieved by conventionally masking other seeds 16 with a layer of photolithographically defined material such as silicon nitride as shown at 28. This silicon nitride mask 28, in addition to covering the seeds 16 on which growth is not desired, may extend along the surface of the insulator layer 14 between seeds 16 and even be contiguous with the seed 16 on which the selective growth occurs, as shown in phantom at 30 in FIG. 2.

Figure 3:
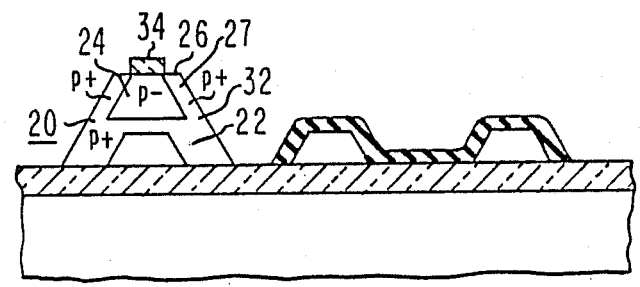

As shown in FIG. 3, a relatively high conductivity (P+ type) portion 32 is next formed along a side 27 of the deposit 20 so as to connect the bottom portion 22 to the top surface 26. This relatively high conductivity side portion 32 may conveniently be formed by masking the central portion of the top surface 26, e.g. with silicon dioxide, as shown at 34, and ion implanting a P type dopant into the sides 27 and the unmasked peripheral portion of the top surface 26.

Figure 4:
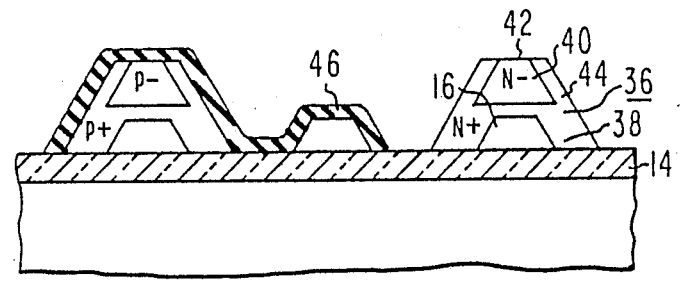

As shown in FIG. 4, a second monocrystalline silicon deposit 36, of second conductivity type (N type when the first conductivity type is P type) is next selectively epitaxially formed on a second silicon seed 16. The second monocrystalline silicon deposit 36 has a height substantially equal to that of the first deposit 20 and also includes a relatively high conductivity (N+ type) bottom portion 38 adjacent to the insulator layer 14, a relatively low conductivity (N− type) top portion 40 extending from the bottom portion 38 to the top surface 42, and a relatively high conductivity (N+ type) side portion 44 extending from the bottom portion 38 to the top surface 42. This second deposit 36 may be fabricated in the same manner as the first deposit 20, i.e. by masking with a silicon nitride mask 46, depositing silicon by the ELO process with appropriate doping, and masking and implanting the side portions 44.

Figure 5:
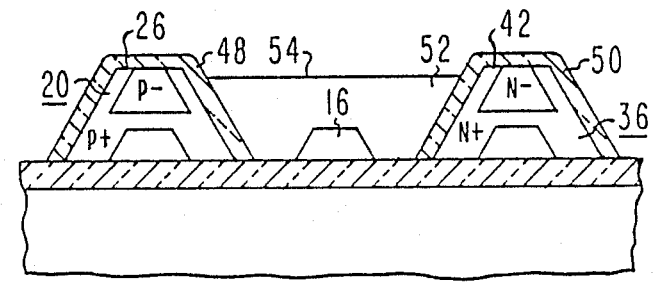

The first and second deposits 20 and 36 are next each covered with insulator layers as identified at 48 and 50 respectively in FIG. 5. In the preferred embodiment the insulator layers 48 and 50 comprise silicon oxide and may be formed by thermal oxidation of the deposits or by conventional chemical vapor deposition (CVD) techniques. A third monocrystalline silicon deposit 52 is then selectively epitaxially formed e.g., by the ELO technique, on a third silicon seed 16. The third silicon deposit 52 has a top surface 54 with a height substantially equal to or less than that of the top surfaces 26 and 42 of the first and second deposits 20 and 36.

Figure 6:
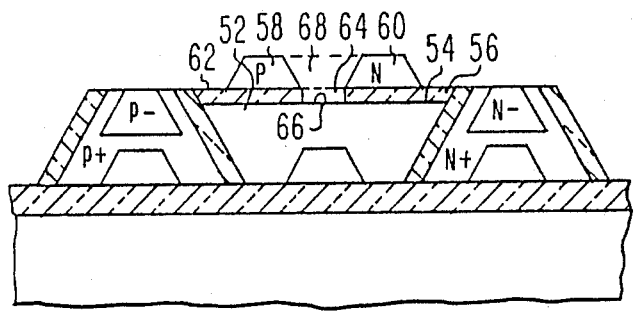

As shown in FIG. 6, an insulator layer 56 e.g. of silicon oxide, is next formed on the top surface 54 of the third deposit 52, and first and second monocrystalline silicon islands 58 and 60, of different conductivity type, are formed on the surface 62 of the insulator layer 56. As shown in phantom in FIG. 6, such a structure can conveniently be fabricated utilizing the aforementioned ELO process by the steps of (a) selectively etching a portion of the insulator layer 56 so as to form an aperture 64 therethrough which exposes a nucleation site 66 on the top surface 54 of the third deposit 52; (b) selectively epitaxially growing monocrystalline silicon from the nucleation site 66 through the insulator layer 56 and laterally over the surface 62 of the insulator layer so as to form a single monocrystalline silicon island 68; (c) selectively etching that portion of the island 68 that extends within and overlies the aperture 64; and (d) selectively doping one island P type and the other island N type. The selective etching of the insulator layer 56, the selective etching of the island 68, and the selective doping of the first and second islands 58 and 60 can be performed using conventional photolithographic, etching and doping techniques.

Figure 7:
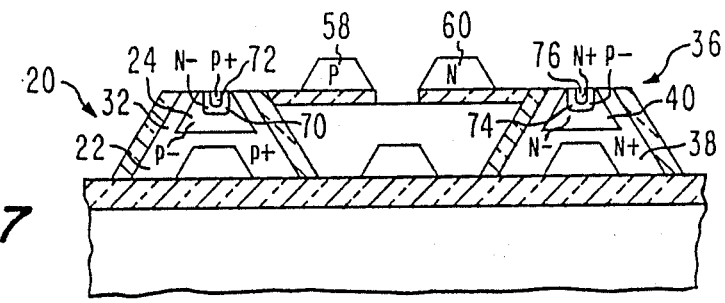
Figure 8:
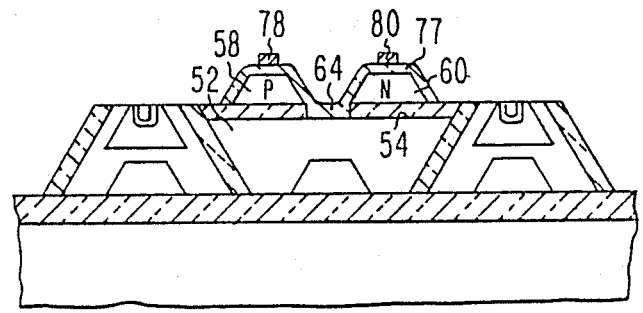
Figure 9:
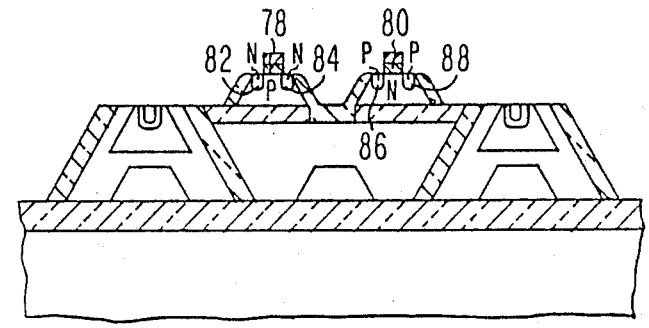

FIGS. 7 through 9 represent the application of conventional bipolar and MOS processing to yield a PNP bipolar transistor in the first deposit 20, an NPN bipolar transistor in the second deposit 36, a PMOS or NMOS transistor in silicon island 58 and, correspondingly, an NMOS or PMOS transistor in the second silicon island 60. For example, as shown in FIG. 7, utilizing conventional masking and doping techniques, an N type base region 70 is formed within the P− type top portion 24 of the first deposit 20 and a P+ type emitter region 72 is formed within the N type base region 70. The P− type top portion 24 and P+ type side portion 32 and bottom portion 22 serve as the collector region of the PNP transistor in the first deposit 20. Similarly, an NPN bipolar transistor is formed in the second deposit 36 by sequentially doping the N− type top portion 40 with a P type base region 74 and N type emitter region 76 so as to also yield three serially disposed regions of alternate conductivity type.

In the fabrication sequence for NMOS and PMOS transistors in the first and second islands 58 and 60, a layer of gate oxide 77 is initially provided in a conventional manner so as to overlie the islands 58 and 60 as shown in FIG. 8. Conveniently, this gate oxide 77 may also be used to fill the aperture 64 formed in the insulator layer 56 on the surface 54 of the third deposit 52. First and second conductive gate electrodes 78 and 80, preferably of relatively heavily doped polycrystalline silicon, are then formed over the first and second islands 58 and 60. These gate electrodes 78 and 80 may be formed conventionally by the steps of (a) applying a layer of polycrystalline silicon; (b) doping the polycrystalline silicon layer; and (c) photolithographically defining the gate electrodes 78 and 80.

As shown in FIG. 9, the gate oxide layer 77 is then removed from the top surfaces of the monocrystalline silicon islands 58 and 60, except in areas which underlie the gates 78 and 80, by conventional photolithographic techniques. Again, using standard photolithographic and doping processes, source and drain regions, 82 and 84 respectively, of one conductivity type are formed in the first island 58 using the first gate electrode 78 as a mask, and opposite conductivity type source and drain regions 86 and 88 are formed in the second island 60. Further elaboration on the fabrication of MOS structures in the first and second islands 58 and 60 may be found, for example, in *Applied Solid State Science*, Supplement 2, Part A, edited by Dawon Kahng, Academic Press, 1981 pp. 301-375.

The structure and fabrication process of the present invention provides significant advantages over conventionally processed DI devices from the standpoints of fabrication cost and manufacturing yield. A large number of DI structures, as described herein, may be fabricated on a single, relatively large silicon wafer using present very large scale integration (VLSI) photolithographic constraints. The invention eliminates both the very long polycrystalline silicon deposition time and the critical lapping step associated with conventional DI processing. Furthermore, the process of the present invention permits the fabrication of relatively thick bipolar devices capable of supporting relatively high voltages. The collector region doping profiles created by the present invention provide a high conductivity contact at the top surface of each deposit due to the high conductivity side portions, and also readily permit the customization of dimensions such as the thickness of the relatively low conductivity (collector region) top portions, so as to achieve a particular base/collector breakdown voltage.

I clam:

1. A dielectrically isolated structure incorporating PMOS, NMOS, PNP and NPN transistors on a silicon wafer, comprising:
    (a) a silicon wafer having a substantially flat major surface;
    (b) an insulator layer on the major surface;
    (c) first, second, and third monocrystalline silicon deposits on the surface of the insulator layer, the deposits being isolated from each other by a layer of insulation on the first and second deposits;
    (d) an insulated layer on the top surface of the third silicon deposit;
    (e) first and second monocrystalline silicon islands on the surface of the insulator layer on the third deposit;
    (f) a bipolar transistor in the first silicon deposit;
    (g) a complementary bipolar transistor in the second silicon deposit;
    (h) an MOS transistor in the first silicon island; and
    (i) a complementary MOS transistor in the second silicon island.

2. structure in accordance with claim 1 wherein the first monocrystalline silicon deposit includes a top surface and sides and comprises:
    (a) a relatively high conductivity first conductivity type bottom portion adjacent to the insulator layer;
    (b) a relatively low conductivity first conductivity type top portion extending from the bottom portion to the top surface; and
    (c) a relatively high conductivity first conductivity type side portion that connects the bottom portion to the top portion.

3. A structure in accorance with claim 1 wherein the second monocrystalline silicon deposit includes a top surface and sides and comprises:
    (a) a relatively high conductivity second conductivity type bottom portion adjacent to the insulator layer;
    (b) a relatively low conductivity second conductivity type top portion extending from the bottom portion to the top surface; and
    (c) a relatively high conductivity second conductivity type side portion that connects the bottom portion to the top portion.

4. A structure in accordance with claim 1 wherein at least one of said bipolar transistors of steps (f) and (g) includes a collector region comprising a lightly doped region extending into and being surrounded by a heavily doped region of the same conductivity type.

* * * * *